United States Patent [19]
Nonomura et al.

[11] Patent Number: 5,881,876
[45] Date of Patent: Mar. 16, 1999

[54] METHOD AND VESSEL FOR STORING A SUBSTRATE CLEANING BRUSH

[75] Inventors: Masahiro Nonomura; Akihiko Morita, both of Kyoto; Naoko Onodera; Fumitake Mieno, both of Kanagawa, all of Japan

[73] Assignee: Dainippon Screen Mfg. Co., Ltd., Japan

[21] Appl. No.: 725,331

[22] Filed: Oct. 1, 1996

[30] Foreign Application Priority Data

Oct. 2, 1995 [JP] Japan .................................. 7-282555

[51] Int. Cl.[6] ..................................... A47L 13/17
[52] U.S. Cl. ........................... 206/361; 206/15.2; 401/23; 428/36.5
[58] Field of Search .................. 206/361–362.4, 206/205–209, 15.2; 401/23, 22, 21; 428/36.5

[56] References Cited

U.S. PATENT DOCUMENTS

| | | | |
|---|---|---|---|
| 3,982,296 | 9/1976 | Russo | 15/38 |
| 4,052,161 | 10/1977 | Atwood et al. | 23/230 R |
| 5,419,646 | 5/1995 | Taylor | 401/21 |
| 5,566,823 | 10/1996 | Summers | 206/209.1 |

*Primary Examiner*—Scott W. Houtteman
*Attorney, Agent, or Firm*—Ostrolenk, Faber, Gerb & Soffen, LLP

[57] ABSTRACT

A method and apparatus for storing a brush body, made of a hydrophilic sponge-like porous material in a readily usable condition employs a substrate cleaning brush stored in a vessel, which vessel is filled with liquid such that the brush body is submerged in the liquid.

30 Claims, 2 Drawing Sheets

METHOD AND VESSEL FOR STORING A
SUBSTRATE CLEANING BRUSH

BACKGROUND OF THE INVENTION

1. Field of the Invention

The present invention relates to a method for storing a substrate cleaning brush, which brush is used in a substrate cleaning apparatus in which various types of substrates, such as semiconductor wafers, glass substrates for liquid display apparatuses or photomasks, or substrates for optical disks, are held horizontally and rotated about a vertical axis while applying cleaning liquid to the substrates and subjecting them to a cleaning action with the brush. More particularly, the present invention is directed to a method for storing a substrate cleaning brush having a brush body which is formed of a sponge-like porous material.

2. Description of the Prior Art

An example of a conventional substrate cleaning apparatus and a conventional method for cleaning a substrate with a cleaning brush will be briefly described. A substrate, such as a semiconductor wafer, is held horizontally on a top surface of a spin chuck by way of a vacuum. Cleaning liquid is applied to the substrate while rotating the substrate on the spin chuck about a vertical axis. A brush rotation shaft of a brush holding arm is rotated so that the cleaning brush which is fixed to the rotation shaft is kept in a downward orientation by the brush holding arm and is lowered from an upper position to a lower position while the cleaning brush rotates. A bottom edge of the cleaning brush is moved close to a surface of the substrate. With the bottom edge of the cleaning brush touching the surface of the substrate, the rotating cleaning brush is brought into movable contact with the surface of the rotating substrate whereby the substrate is cleaned. In such a substrate cleaning apparatus, the cleaning brush is replaced with the same or a different type of cleaning brush in accordance with the type of substrates to be cleaned or the cleaning requirements. To this end, the cleaning brush is structured so that it can be mounted to, and detached from, the brush rotation shaft of the brush holding arm.

The cleaning brush is comprised of a brush holder and a brush body. Although the brush body generally has a number of bristles disposed on a bottom surface thereof, a brush body of a hydrophilic sponge-like porous material, which, for example, may be manufactured from polyvinyl alcohol, may also be used. A cleaning brush which employs a brush body made of a porous material is conventionally housed, stored and transported in a dry vessel. At a semiconductor production plant or the like, a user sufficiently impregnates the brush body with cleaning liquid, such as pure water, to wet the brush body before using the cleaning brush. The user then cleans a dummy substrate with the brush and, thereafter, uses the brush in a production line.

However, a brush body made of a hydrophilic sponge-like porous material is hard and has no elasticity when it is dry. Hence, it takes a considerably long time to impregnate the brush body with pure water or the like to make the brush body soft enough for use. It may take as long as from thirty minutes to six hours before the brush is usable in a production line.

In addition, particles may adhere to a brush body made of a porous material during storage or transportation of the cleaning brush. Thereafter, when the cleaning brush is used to clean substrates, the cleaning brush may cause adhesion of the particles to a surface of a substrate being cleaned. It is also possible that the brush body will create very fine dust during storage or transportation of the cleaning brush because the brush body becomes hardened. The dust may adhere to a surface of a substrate when the substrate is cleaned.

Further, a conventional brush body may become deformed when the wet, newly manufactured brush body is dried, stored or transported and, thereafter, moistened again prior to using the cleaning brush.

SUMMARY OF THE INVENTION

A first aspect of the present invention is directed to a method of storing a brush for cleaning a substrate, the brush having a porous brush body made of hydrophilic material, comprising the steps of: a) preparing a vessel capable of containing the brush; and b) storing the brush in a vessel containing a liquid.

According to a second aspect of the present invention, the brush body is preferably a sponge of polyvinyl alcohol and the liquid includes an aqueous solution selected from the group of hydrogen peroxide and isopropyl alcohol.

According to a third aspect of the present invention, a lid and a gasket are adapted to fit the top opening of the vessel, and the above method has the additional step of c) sealing a gap between the vessel and the lid with the gasket.

Using the method of storing a brush according to the first aspect of the present invention, it is possible to keep a substrate cleaning brush, having a brush body of a sponge-like porous hydrophilic material, readily usable for the cleaning of a substrate. Hence, it is possible to shorten the line operation starting time for cleaning substrates when a substrate cleaning apparatus is employed. Further, since the present invention also prevents adhesion of particles to the brush body during storage or transportation of the cleaning brush and prohibits the discharge of dust from the brush body, it is possible to prevent adhesion of undesirable particles to the surface of a substrate during cleaning of the substrate and, therefore, improves the quality of the substrate. Moreover, since deformation of the brush body, resulting from the wetting and drying of the brush body, is prevented using the present invention, it is possible to maintain the cleaning performance obtained from the brush body.

Using the method of storing a brush according to the second aspect of the present invention, it is possible to maintain the quality of the brush body while the cleaning brush is stored because the liquid contained in the vessel does not erode, decompose, or allow elusion of substances from the brush body. Further, the growth of microorganisms within the vessel is suppressed and the liquid contained in the vessel is soluble in pure water and, therefore, the cleaning brush may be taken from the vessel and used directly to clean a substrate.

The method of storing a brush according to the third aspect of the present invention prevents leakage and evaporation of the liquid, which is contained in the vessel, during storage or transportation of the cleaning brush and also prevents the migration of particles into the vessel. Further, since the brush body is always entirely submerged in the liquid, even when the vessel is inclined or positioned upside-down, the desirable effects according to the first aspect of the present invention are maintained.

Accordingly, the objects of the present invention are to provide a method and apparatus in which it is possible to make a brush body of a hydrophilic sponge-like porous material readily available when immediate use of a stored substrate cleaning brush is required. Thus, line operation starting time is reduced, adhesion of particles to the brush body during storage or transportation of the cleaning brush is prevented, creation of dust from the brush body is prevented, adhesion of particles to the surface of a substrate during the cleaning of the substrate is prevented and deformation of the brush body is prevented.

These and other objects, features, aspects and advantages of the present invention will become more apparent from the following detailed description of the present invention when taken in conjunction with the accompanying drawings.

BRIEF DESCRIPTION OF THE DRAWING(S)

DESCRIPTION OF THE PREFERRED EMBODIMENT

A preferred embodiment of the present invention will now be described with reference to the drawings.

Figure 1:
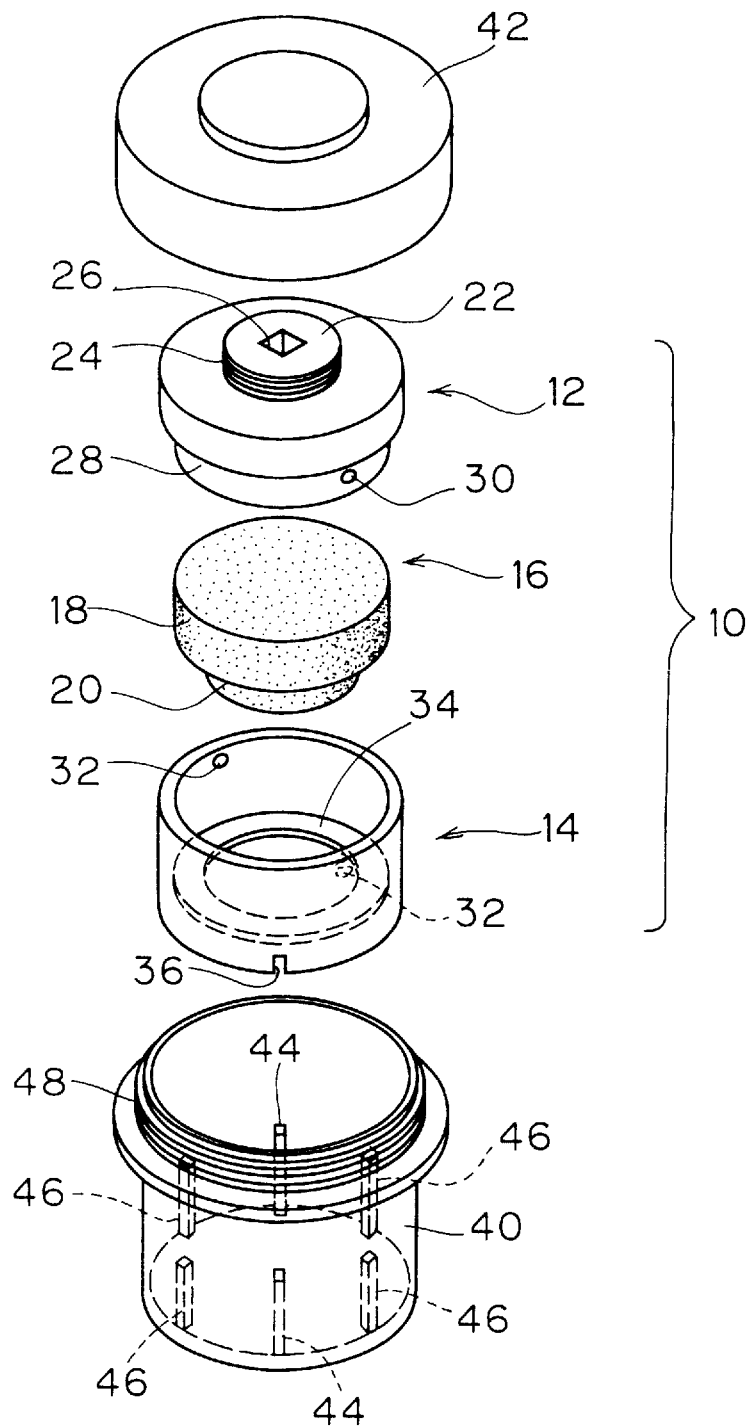
FIG. 1 is an exploded perspective view of a substrate brush and brush storing apparatus according to a preferred embodiment of the present invention.
Figure 2:
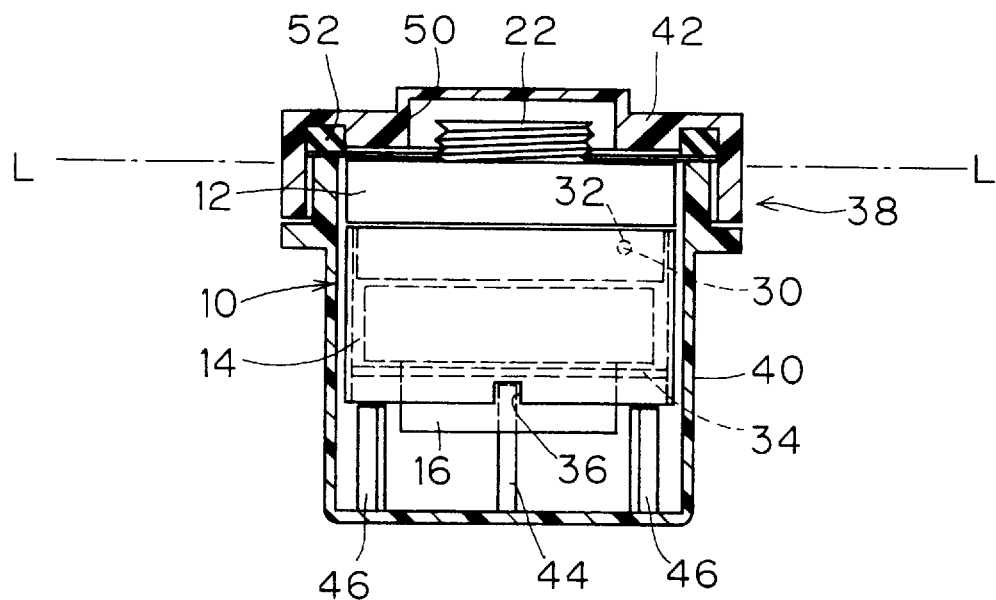
FIG. 2 is a partial vertical cross sectional view showing the cleaning brush of FIG. 1 housed in the vessel of FIG. 1.
Figure 3:
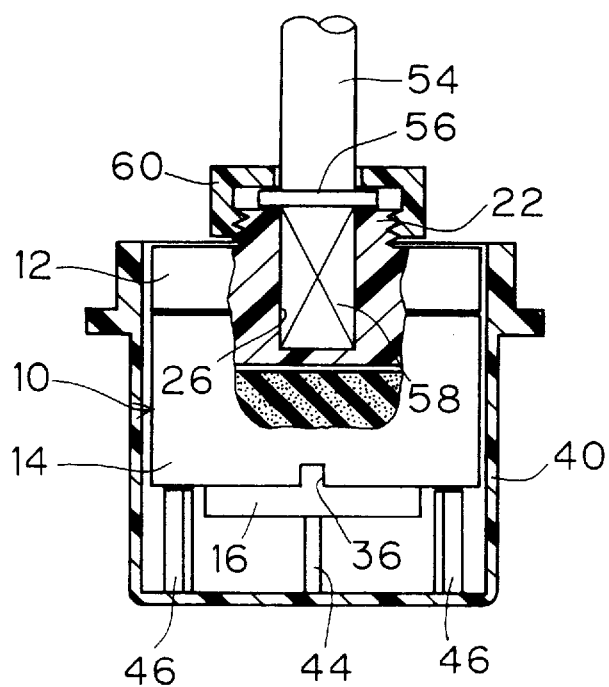
FIG. 3 is a partial vertical cross sectional view showing the cleaning brush of FIG. 1 attached to a brush rotation shaft of a substrate cleaning apparatus.

The cleaning brush 10 shown in FIGS. 1 to 3 is formed by coupling a brush body 16 to a brush holder, which brush holder is comprised of an upper mounting part 12 and a lower holding part 14. A large diameter portion 18 of the brush body 16 has a larger diameter than a small diameter portion 20 of the brush body 16. The brush body 16 is formed of a hydrophilic sponge-like porous material which is manufactured, for example, from polyvinyl alcohol. The porous material is obtained by (i) linking formaldehyde to polyvinyl alcohol using, for example, oxygen as catalyst; (ii) adding a pore creating agent during the creation of polyvinylformal so that pores form in the polyvinyl; and iii) extracting the pore creating agent after completing the insoluble porous material. When the brush body 16 is formed of polyvinylformal material having pores therein, the brush body 16 is hydrophilic, exhibits excellent softness and elasticity when wet and becomes hard, having no elasticity, when dry.

An engagement part 22 is integral to and projects from the central portion of a top surface of the upper mounting part 12 of the brush holder. The engagement part 22 is used for mounting the cleaning brush 10 to a brush rotation shaft of the substrate cleaning apparatus (not shown). An external thread 24 is formed on the engagement part 22. Further, a rectangular hole 26 is disposed in the center of the top surface of the engagement part 22 along a center axis of the upper mounting part 12. The bottom half portion (fitting part 28) of the upper mounting part 12 has a smaller diameter than the top half portion of the upper mounting part 12. The upper cylindrical rim portion of the lower holding part 14 engages the fitting part 28 of the upper mounting part 12. In FIG. 1, a small projecting detent 30 is formed on the outer peripheral surface of the fitting part 28 of the upper mounting part 12 and engages a small concave detent 32 when the rim portion of the lower holding part 14 engages the fitting part 28. The outer diameter of the lower holding part 14 is the same as the outer diameter of the top half portion of the upper mounting part 12, whereas the inner diameter of the lower holding part 14 is slightly larger than the outer diameter of the large diameter portion 18 of the brush body 16. Further, a support ring 34 (or flange) is integrally disposed on the inner peripheral surface of the lower holding part 14 near a bottom edge portion of the lower holding part 14. The inner diameter of the support ring 34 is a little larger than the outer diameter of the small diameter portion 20 of the brush body 16 but is smaller than the outer diameter of the large diameter portion 18. On the bottom edge portion of the lower holding part 14, two rotation preventing notches 36 are disposed 180 degrees from each other. It is preferable that the brush holder 12, 14 is formed of a plastic material such as a polypropylene.

The brush body 16 is fitted to the brush holder 12, 14 by inserting the small diameter portion 20 of the brush body 16 into the aperture of the support ring 34 of the lower holding part 14 so that the brush body 16 is housed in the lower holding part 14. The fitting part 28 of the upper mounting part 12 is secured to the top edge portion of the lower holding part 14 via the detents 30, 32. While the brush body 16 is supported by the support ring 34 of the lower holding part 14, movement of the brush body 16 against the brush holder in a vertical direction is restricted because the top surface of the brush body 16 contacts the bottom surface of the upper mounting part 12, and movement of the brush body 16 against the brush holder in a horizontal direction is restricted by the inner peripheral surface of the lower holding part 14. The bottom edge surface of the brush body 16 projects below the bottom edge of the lower holding part 14 when the brush body 16 is held in the brush holder.

A vessel 38 (FIG. 2) is formed of a vessel body 40 and a lid member 42. The vessel 38 is preferably made of a plastic material such as a polypropylene. A top surface of the vessel body 40 is open, and the inner diameter of the vessel body 40 is slightly larger than the outer diameter of the brush holder 12, 14 of the cleaning brush 10. Further, two rotation preventing rod-like projections 44 extend axially from an inner bottom surface of the vessel body 40 and up an inner peripheral surface of the vessel body 40. The projections 44 are spaced 180 degrees away from each other. Four support rod-like projections 46 extend axially from the inner bottom surface and up the inner peripheral surface of the vessel body 40. The projections 46 are a little shorter than the rotation preventing rod-like projections 44 and are disposed on the inner peripheral surface of the vessel body 40 in such a manner that the support rod-like projections 46 and the two rotation preventing rod-like projections 44 are spaced from each other by 60 degrees.

As shown in FIG. 2, when the cleaning brush 10 is inserted into the vessel body 40 the rotation preventing notches 36 of the lower holding part 14 engage the rotation preventing rod-like projections 44 of the vessel body 40 so that the cleaning brush 10 is fixed within the vessel body 40 so as not to rotate about the center axis. Further, the bottom edge of the lower holding part 14 of the brush holder of the cleaning brush 10 contacts the top edges of the four support rod-like projections 46 so that the four support rod-like projections 46 support the cleaning brush 10 within the vessel body 40. The bottom edge surface of the brush body 16 of the cleaning brush 10 does not contact the inner bottom surface of the vessel body 40.

An external thread 48 is provided on the outer peripheral surface of the top edge portion of the vessel body 40. Although not shown in FIG. 1, an internal thread is provided on an inner peripheral surface of the lid member 42 which engages the external thread 48 of the vessel body 40. A concave portion 50 is disposed in a central portion of an inner top surface of the lid member 42 which receives the engagement part 22 of the cleaning brush 10. A surface portion of the inner top surface of the lid member 42, radially adjacent the concave portion 50, serves to restrict the movement of the cleaning brush 10 or limit the movement of the cleaning brush 10 to an allowable range when it operatively engages the top surface of the brush holder of the cleaning brush 10. A gasket 52 is attached to a peripheral edge portion of the inner top surface of the lid member 42 which keeps the vessel 38 air-tight when the gasket 52 is brought into tight contact with the top edge of the vessel body 40 by threadingly fitting the lid member 42 to the vessel body 40.

The cleaning brush 10 is first housed in the vessel body 40 of the vessel 38 in the manner shown in FIG. 2 and thereafter a liquid, such as hydrogen peroxide and isopropyl alcohol, is injected into the vessel body 40. Finally, the top surface opening of the vessel body 40 is sealed by the lid member 42. Alternatively, the brush body may be housed in the vessel 38 after the liquid is provided in the vessel body 40 and the top surface opening of the vessel body 40 may thereafter be sealed by the lid member 42. The hydrogen peroxide and isopropyl alcohol does not erode or decompose the brush body 16 or allow elusion of substances from the brush body 16. Hydrogen peroxide and isopropyl alcohol are preferable liquids because they are effective in suppressing the growth of microorganisms within the vessel 38 and are soluble in pure water.

The quantity of liquid to be injected into the vessel 38 is determined so that the brush body 16 is always entirely submerged in the liquid even when the vessel 38 is inclined or positioned upside down during storage or transportation. Preferably, the vessel 38 is filled with the liquid up to a level L at the opening of the vessel 38 (FIG. 2). When the vessel 38 is sealed with the lid member 42 threadingly fitted to the vessel body 40, movement of the cleaning brush 10 within the vessel 38 is restricted or limited to an allowable range so that the cleaning brush 10 never moves appreciably within the vessel 38 during storage or transportation. In addition, since the bottom edge surface of the brush body 16 is held so as not to contact the inner bottom surface of the vessel body 40, the brush body 16 is never deformed during storage or transportation of the cleaning brush 10. Further, when the vessel 38 is sealed, the liquid never leaks out or evaporates from the vessel 38 and particles never get into the vessel 38 during storage or transportation. Moreover, since the brush body 16 of the cleaning brush 10 is always entirely submerged in the liquid, the brush body 16 is maintained in its soft and elastic state. Hence, the cleaning brush 10 is readily usable for the cleaning of a substrate immediately after being taken out of the vessel 38.

Next, with reference to FIG. 3, a description will be given of (i) mounting the cleaning brush 10 to a brush rotation shaft; (ii) detaching the cleaning brush 10, which has been mounted to the brush rotation shaft, from the brush rotation shaft; and (iii) housing the cleaning brush 10 in the vessel 38.

As shown in FIG. 3, a brush rotation shaft 54 for mounting the cleaning brush 10 includes a flange portion 56 near the bottom edge of the brush rotation shaft 54 and a portion 58 which is closer to the bottom edge of the rotation shaft 54 than the flange portion 56. The portion 58 has a rectangular cross section and is received by the rectangular hole 26 which is disposed in the center of the top edge surface of the engagement part 22 of the cleaning brush 10. Further, an internally threaded nut 60 threadingly engages the external thread 24 of the engagement part 22 of the cleaning brush 10 and operatively engages the flange portion 56 of the brush rotation shaft 54 such that it freely rotates about the brush rotation shaft 54.

The attachment of the cleaning brush 10 to the brush rotation shaft 54 will now be described in detail. First, the vessel 38 is opened by removing the lid member 42 of the vessel 38 such that the top surface of the brush holder 12 at the cleaning brush 10 is exposed through the opening at the top of the vessel body 40. Next, while keeping the cleaning brush 10 housed within the vessel body 40, the vessel body 40 is manually positioned below the brush rotation shaft 54 and the rectangular hole 26 of the engagement part 22 is fit to the rectangular rod portion 58 of the brush rotation shaft 54. Next, with the vessel body 40 supported by hand, the nut 60 is threadingly engaged to the external thread 24 of the engagement part 22. Since the rotation preventing notches 36 of the lower holding part 14 of the brush holder engage the top edge portions of the rotation preventing rod-like projections 44 of the vessel body 40, the cleaning brush 10 does not rotate within the vessel body 40 despite the rotation of the nut 60. When the cleaning brush 10 is attached to the brush rotation shaft 54 as shown in FIG. 3, the vessel body 40 is pulled downward to separate the vessel body 40 from the cleaning brush 10. The above operations are performed without touching the cleaning brush 10 with human hands.

When the cleaning brush 10 is to be detached from the brush rotation shaft 54, the vessel body 40 is positioned below the cleaning brush 10 which has been mounted to the brush rotation shaft 54. The vessel body 40 is placed over the cleaning brush 10 such that the rotation preventing notches 36 of the lower holding part 14 of the brush holder engage the top edge portions of the rotation preventing rod-like projections 44 of the vessel body 40. Next, the nut 60 is unthreaded while the vessel body 40 is supported by hand, thereby disengaging the nut 60 from the engagement part 22. It is noted that when the vessel body 40 is held, the cleaning brush 10 does not rotate within the vessel body 40 despite rotation of the nut 60. Upon disengagement of the nut 60 from the engagement part 22, the vessel body 40 is pulled downward, the rectangular hole 26 of the engagement part 22 is removed from the rectangular rod portion 58 of the brush rotation shaft 54, and the cleaning brush 10 is detached from the brush rotation shaft 54. After filling the vessel body 40 with hydrogen peroxide liquid or isopropyl alcohol, the lid member 42 is fit to the vessel body 40. The cleaning brush 10 is not touched with human hands during the removal process.

Although the brush storing method according to the present invention has been described in relation to the preferred embodiment, shown in FIGS. 1 to 3, the method according to the present invention is not limited to the description above and FIGS. 1 to 3. Indeed, the structure of the brush holder of the cleaning brush, the configuration and the material of the brush body, etc., are not limited to those described above in relation to the preferred embodiment. Further, although the preferred embodiment above describes only one substrate cleaning brush housed in the vessel, a plurality of substrate cleaning brushes may be housed and stored in a vessel which is filled with liquid.

While the invention has been described in detail, the foregoing description is in all aspects illustrative and not restrictive. It is understood that numerous other modifications and variations can be devised without departing from the scope of the invention.

What is claimed is:

1. A method of storing a substrate cleaning brush, said brush including a brush holding portion having a bottom end with an aperture and a porous brush body made of hydrophilic material which projects through said aperture, said method comprising the steps of:

a) preparing a vessel capable of containing said brush;

b) holding said brush by the brush holding portion; and c) storing said brush in liquid disposed in said vessel.

2. The method of claim 1, wherein step c) includes the steps of: inserting said brush into said vessel, and supplying said liquid into said vessel.

3. The method of claim 2, wherein step c) includes the step of supplying said liquid into said vessel such that said body is fully submerged in said liquid.

4. The method of claim 1, wherein step c) includes the steps of supplying said liquid into said vessel, and inserting said brush into said liquid in vessel.

5. The method of claim 1, wherein said brush body is a sponge of polyvinyl alcohol, and said liquid includes an aqueous solution of a material selected from the group consisting of hydrogen peroxide and isopropyl alcohol.

6. The method of claim 5 further comprising the step of closing a top opening of said vessel with a lid.

7. The method of claim 6, wherein said lid is provided with a gasket adapted to said top opening of said vessel, and the method further includes the step of sealing a gap between said vessel and said lid with said gasket.

8. The method of claim 7, further including the step of supporting said brush holder in said vessel such that said bottom of said brush body is spaced from a bottom surface of said vessel.

9. A vessel for storing a substrate cleaning brush, comprising:

a brush holding portion having a bottom end with an aperture;

a porous brush body made of hydrophilic material which projects through said aperture;

a vessel body capable of containing said brush; and a liquid disposed in said vessel such that said brush contacts said liquid.

10. The vessel of claim 9, wherein said lid is provided with a gasket adapted to a top edge of said vessel.

11. The vessel of claim 10, wherein said vessel body includes an inner wall, and a plurality of projections extending from said inner wall toward a center of said vessel.

12. The vessel of claim 11, wherein said lid includes a flat top, and a hood portion projected from said flat top.

13. The vessel of claim 12, wherein said vessel body and said lid are made of plastic.

14. An apparatus for storing a substrate cleaning brush comprising:

a brush holding portion having an interior surface, an open top end and a bottom end, said bottom end including an aperture and said brush holding portion receiving said brush such that said brush projects through said aperture;

a mounting portion having top, bottom and side surfaces, said mounting portion engaging said brush holding portion and substantially closing said top end of said brush holding portion;

a vessel body having an open end and a closed end, said brush holding portion, said brush and said mounting portion being disposed in said vessel body; and a lid for sealing said vessel body.

15. The apparatus of claim 14 wherein said brush includes a porous brush body made of hydrophilic material.

16. The apparatus of claim 14 wherein said brush holding portion includes a flange disposed on said interior surface.

17. The apparatus of claim 16 wherein said flange defines an aperture through which a bottom surface of said brush extends.

18. The apparatus of claim 17 wherein said bottom surface of said brush extends below the bottom end of said brush holding portion.

19. The apparatus of claim 14 wherein said brush holding portion includes at least one detent element and said mounting portion includes at least one corresponding detent element, said detent element and said corresponding detent element operatively engaging one another to secure said mounting portion to said brush holding portion.

20. The apparatus of claim 19 wherein said detent element is disposed on the interior surface of said brush holding portion and said corresponding detent element is disposed on said side surface of said mounting portion.

21. The apparatus of claim 14 wherein said brush holding portion includes at least one notch disposed on said bottom end thereof and said vessel body includes at least one protrusion disposed on a side inside surface of said vessel body, said protrusion engaging said notch to fix at least one of a rotational movement and an axial movement of said brush holding portion with respect to said vessel body.

22. The apparatus of claim 21 wherein said protrusion extends at least partially up said side inside surface of said vessel body such that said bottom end of said brush holding portion is spaced from said bottom inside surface of said vessel body and said brush holding portion does not rotate with respect to said vessel body.

23. The apparatus of claim 22 wherein said bottom surface of said brush extends below said bottom end of said brush holding portion and said notch and said protrusion is located such that said bottom surface of said brush is spaced from said bottom inside surface of said vessel body.

24. The apparatus of claim 22 including two protrusions disposed on said vessel body spaced 180° with respect to one another and said brush holding member includes two corresponding notches.

25. The apparatus of claim 24 wherein said vessel body includes a plurality of projections disposed on said side inside surface of said vessel body, said projections being disposed such that they engage the bottom end of said brush holding portion but cannot engage said notch.

26. The apparatus of claim 25 wherein said vessel body includes four projections extending at least partially up said side inside surface of said vessel body, said four projections not extending as far up said side inside surface as said two protrusions, each of said projections being spaced 60° from one of said two protrusions.

27. The apparatus of claim 14 wherein said mounting portion includes an engagement portion disposed in said top surface, said mounting portion being engageable with a shaft.

28. The apparatus of claim 27 wherein said engagement portion includes a bore for engaging said shaft, said bore being shaped such that said mounting portion does not rotate with respect to said shaft.

29. The apparatus of claim 28 wherein said engagement portion is externally threaded for operative engagement with an internally threaded nut of said shaft such that said mounting portion is fixed to said shaft.

30. The apparatus of claim 14 wherein said lid includes a gasket for operative engagement between said open end of said vessel body and said lid such that the vessel body is sealed when said lid is fixed to said vessel body.

* * * * *

UNITED STATES PATENT AND TRADEMARK OFFICE
CERTIFICATE OF CORRECTION

PATENT NO. : 5,881,876
DATED : March 16, 1999
INVENTOR(S) : Nonomura et al.

It is certified that error appears in the above-identified patent and that said Letters Patent is hereby corrected as shown below:

Cover page, at item [73], change "Dainippon Screen Mfg. Co., Ltd.," to --Dainippon Screen Mfg. Co., Ltd., Japan and Fujitsu Limited, Japan--.

Signed and Sealed this

Twenty-fourth Day of August, 1999

Attest:

Q. TODD DICKINSON

*Attesting Officer*                *Acting Commissioner of Patents and Trademarks*